United States Patent
Nakagawara

(10) Patent No.: US 12,295,101 B2
(45) Date of Patent: May 6, 2025

(54) ELECTRONIC COMPONENTS

(71) Applicant: CANON KABUSHIKI KAISHA, Tokyo (JP)

(72) Inventor: Naoyuki Nakagawara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 316 days.

(21) Appl. No.: 17/942,238

(22) Filed: Sep. 12, 2022

(65) Prior Publication Data

US 2023/0100735 A1  Mar. 30, 2023

(30) Foreign Application Priority Data

Sep. 27, 2021 (JP) .................................. 2021-157241

(51) Int. Cl.
- *H05K 1/14* (2006.01)
- *H04N 23/54* (2023.01)
- *H04N 23/80* (2023.01)

(52) U.S. Cl.
CPC ............. *H05K 1/147* (2013.01); *H04N 23/54* (2023.01); *H04N 23/80* (2023.01); *H05K 2201/10128* (2013.01); *H05K 2201/10151* (2013.01)

(58) Field of Classification Search
CPC ......... H05K 1/147; H05K 2201/10128; H05K 2201/10151; H04N 23/80; H04N 23/54
USPC ........................................................ 361/749
See application file for complete search history.

(56) References Cited

U.S. PATENT DOCUMENTS

| | | | | |
|---|---|---|---|---|
| 11,462,998 | B2* | 10/2022 | Kwak | .................... H02M 3/10 |
| 2013/0083505 | A1* | 4/2013 | Kobayashi | ........... H05K 1/0245 |
| | | | | 174/250 |
| 2016/0066410 | A1* | 3/2016 | Cho | ....................... H05K 1/028 |
| | | | | 361/749 |
| 2017/0271799 | A1* | 9/2017 | Axelowitz | ............. H05K 3/363 |

FOREIGN PATENT DOCUMENTS

JP  2018-098290 A  6/2018

* cited by examiner

*Primary Examiner* — Binh B Tran
(74) *Attorney, Agent, or Firm* — Cowan, Liebowitz & Latman, P.C.

(57) ABSTRACT

An electronic component comprises: a first board; a first flexible board that is used to connect the first board and a second board; and a first transmission wiring, formed on the first board, the second board and the first flexible board, that transmits a signal from the first board to the second board. One of the first flexible board is connected to the first board with a conductive connecting material, and a connector capable of attaching to and detaching from the second board is provided on the other end of the first flexible board.

11 Claims, 6 Drawing Sheets

FIG. 3A
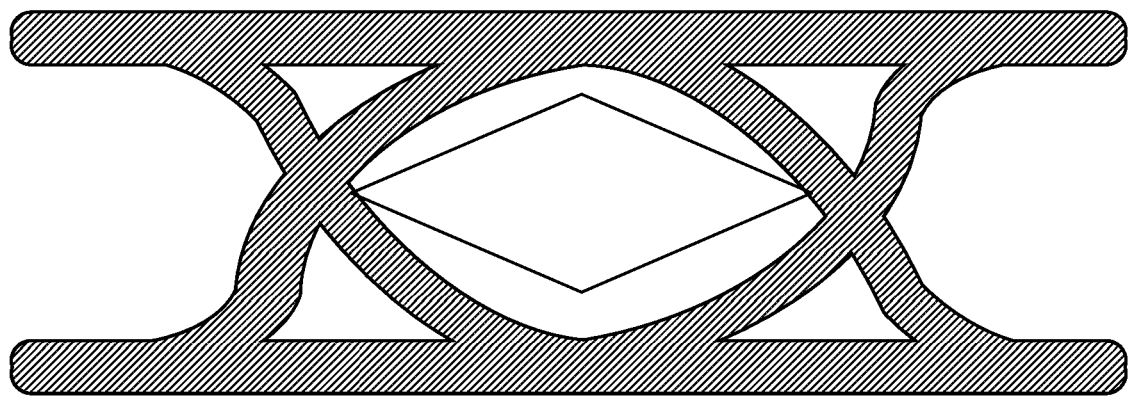
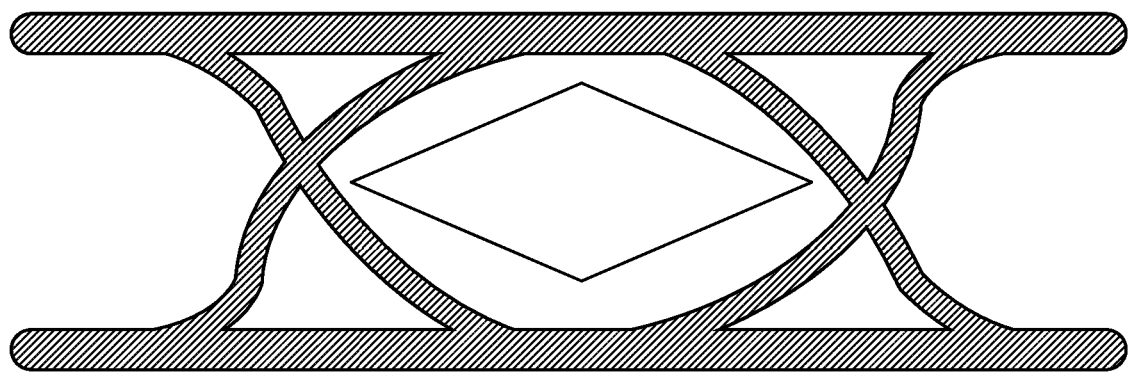
FIG. 3B

ELECTRONIC COMPONENTS

BACKGROUND OF THE INVENTION

Field of the Invention

The present invention relates to an electronic component, and more particularly to high-speed signal transmission technology in a configuration in which boards are connected with a flexible board.

Description of the Related Art

In recent years, in an image capturing apparatus, a technique of taking a plurality of images in a short time and synthesizing them to expand the resolution, sensitivity, dynamic range, etc. has attracted attention. In order to capture a plurality of images in a short time and combine them, speeding up the signal transmission from the image sensor to the image processing circuit is one of the important basic techniques. In order to increase the speed of signal transmission, a method of increasing the frequency of signal transmission may be considered first, but Pulse Amplitude Modulation (PAM) 4 transmission, which can increase the number of bits that can be transmitted in 1 Unit Interval (UI), is also attracting attention.

Further, in recent mirrorless cameras, in order to improve the performance of image stabilization in their bodies, it has been common to connect a board on which an image sensor is mounted and a board that processes a signal from the image sensor using a flexible board.

However, conventionally, there is a problem that, in a case where the boards are connected with a flexible board with a connector and a signal is transmitted at high speed, signal reflection in which a part of the signal is reflected due to an impedance mismatch at the connector portion occurs. FIG. 6A shows a configuration in which the boards are connected using a flexible board with a connector, and FIG. 6B shows an example of an impedance profile of the configuration shown in FIG. 6A. It can be seen that the impedance of the connector portion of the board on the transmitting side (TX) and the impedance of the connector portion of the board on the receiving side (RX) have dropped from the target value (here, 100Ω).

To solve such a problem, Japanese Patent Laid-Open No. 2018-98290 discloses that the impedance of a transmission line is intentionally controlled to be low in order to prevent the signal reflection generated by the impedance mismatch at the connector portion.

However, in the prior art disclosed in Japanese Patent Laid-Open No. 2018-98290, since the impedance of the transmission line cannot be aligned to 100Ω, there are cases in which signal reflection due to impedance mismatch cannot be accepted.

SUMMARY OF THE INVENTION

The present invention has been made in consideration of the above situation, and, in a configuration in which the boards are connected with a flexible board, enables highly reliable high-speed signal transmission without significantly impairing the ease of assembly.

According to the present invention, provided is an electronic component comprising: a first board; a first flexible board that is used to connect the first board and a second board; and a first transmission wiring, formed on the first board, the second board and the first flexible board, that transmits a signal from the first board to the second board, wherein one of the first flexible board is connected to the first board with a conductive connecting material, and a connector capable of attaching to and detaching from the second board is provided on the other end of the first flexible board.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 3A and 3B are diagrams for explaining improvement of an eye pattern according to the first embodiment.

DESCRIPTION OF THE EMBODIMENTS

Figure 1:
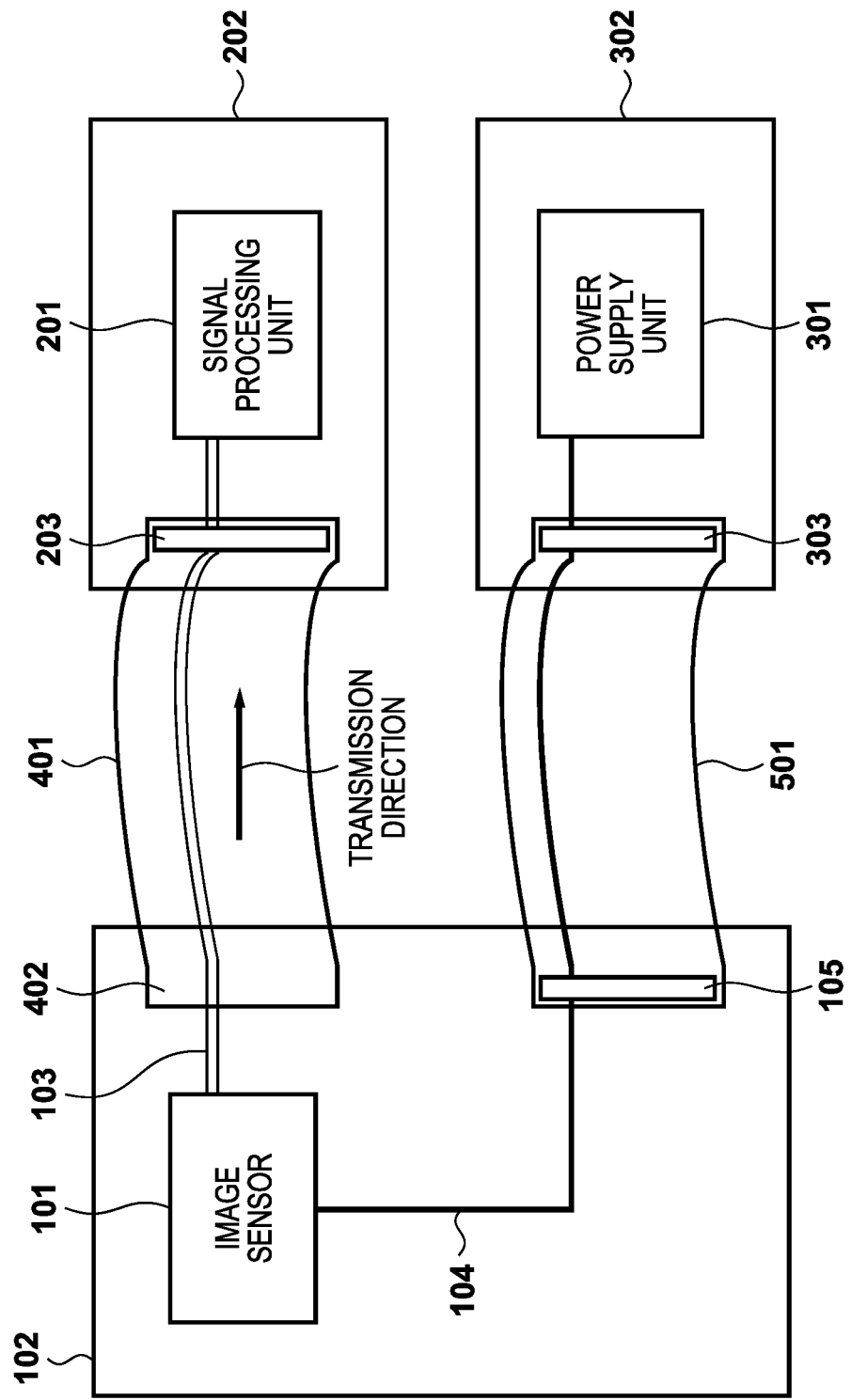
FIG. 1 is a diagram showing a configuration of electronic components according to a first embodiment of the present invention.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

First Embodiment

FIG. 1 is a diagram showing a configuration of electronic components according to a first embodiment of the present invention.

An image sensor 101 is an image sensor such as a CMOS image sensor, and outputs an image signal corresponding to the incident light. The image sensor 101 is generally configured from a pixel block including photodiodes and the like, a processing circuit block that performs A/D conversion that converts an analog signal into a digital signal, and the like, a transmission circuit block that outputs the converted digital data, and the like.

The image sensor 101 is mounted on a board 102, which is hereinafter referred to as an "image sensor board". The image sensor board 102 is a printed circuit board, and in addition to the image sensor 101, electronic parts (not shown) are mounted, and a high-speed signal transmission wiring 103 and a power supply wiring 104 are formed with a metal such as copper or the like. The image sensor board 102 is preferably a rigid board since the image sensor 101 is mounted, and may be made of, for example, glass epoxy. However, the present invention is not limited to this, and an LTCC (co-fired ceramics) board using ceramics and copper wiring may be used. Alternatively, any board, made of a specific material, on which a pattern is formed with a metal wiring such as copper wiring and parts can be mounted, may be used.

A signal processing unit 201 performs image processing and the like on an image signal output from the image sensor 101, and also performs communication for actuating the image sensor 101 and outputs a control signal of the image sensor 101.

The signal processing unit 201 is mounted on a board 202, which is referred to as a "signal processing board", hereinafter. In addition to the signal processing unit 201, a connector fitting portion 203, other electrical parts (not shown), and the like are mounted on the signal processing board 202, and the high-speed signal transmission wiring 103 is made of a metal such as copper or the like on the signal processing board 202.

A flexible board 401 is used to connect the image sensor board 102 and the signal processing board 202. The flexible board 401 has a flexible board made of polyimide or the like, a wiring layer made of a metal foil or the like, and a cover layer which is an insulating layer. On the flexible board 401, the high-speed signal transmission wiring 103, communication wiring (not shown) for actuating the image sensor 101, control signal wiring for the image sensor 101, and the like are formed with a metal such as copper or the like.

The high-speed signal transmission wiring 103 is a wiring formed on the image sensor board 102, the flexible board 401, and the signal processing board 202 for transmitting pixel signals and the like from the image sensor 101 to the signal processing unit 201 at high speed. In general, high-speed signal transmission wiring often performs differential transmission using two signal lines, passing currents of opposite phases to each other, to transmit a signal by a potential difference between the signal lines. By using differential transmission, even if the same noise is applied to the two signal lines, the noise is canceled and malfunction becomes less likely to occur. The high-speed signal transmission wiring 103 of the present embodiment also performs differential transmission in the same manner.

The effect of impedance mismatch is greater at a position closer to the transmitting side comparing to a position on the receiving side, so direct connection of the transmitting side is more effectively reduce the effect of impedance mismatch. Therefore, in the present embodiment, the image sensor board 102 which is on the signal transmitting side and the flexible board 401 are directly connected by a direct connecting portion 402 using the conductive connecting member without using a connector. On the other hand, the flexible board 401 and the signal processing board 202, which are on the signal receiving side, are connected via the connector fitting portion 203.

The direct connecting portion 402 connects the image sensor board 102 and the flexible board 401 by connecting an opening in which a metal wiring formed on the image sensor board 102 is exposed and an opening (one end portion) in which a metal wiring formed on the flexible board 401 is exposed with a conductive connecting material.

The connector fitting portion 203 connects the signal processing board 202 and the end (another end) of the flexible board 401 with a Board to Board connector, a flip-lock type connector, or the like. The connector fitting portion 203 makes it possible to attach/detach the flexible board 401 to/from the signal processing board 202 as needed.

Figure 2A:
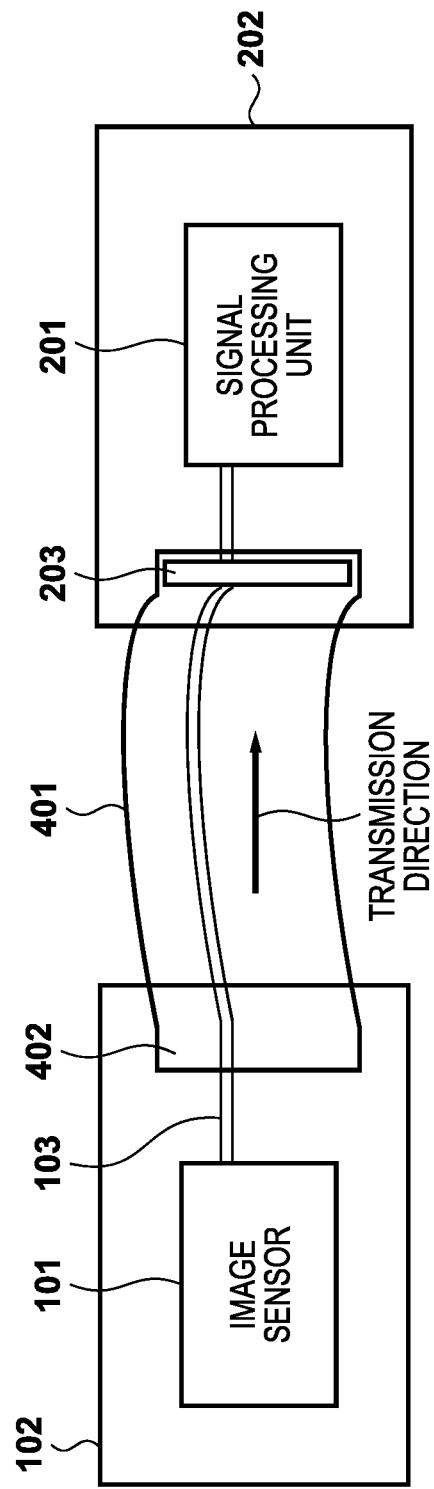
FIGS. 2A and 2B are diagrams illustrating a configuration and an impedance profile of electronic components according to the first embodiment.
Figure 2B:
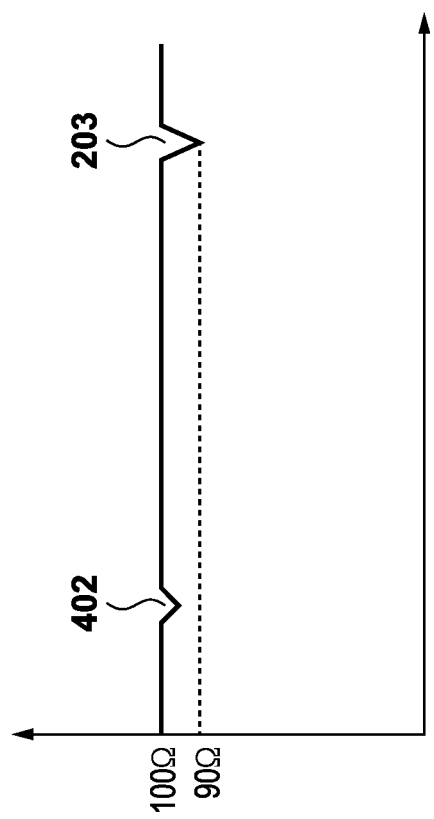
Figure 6A:
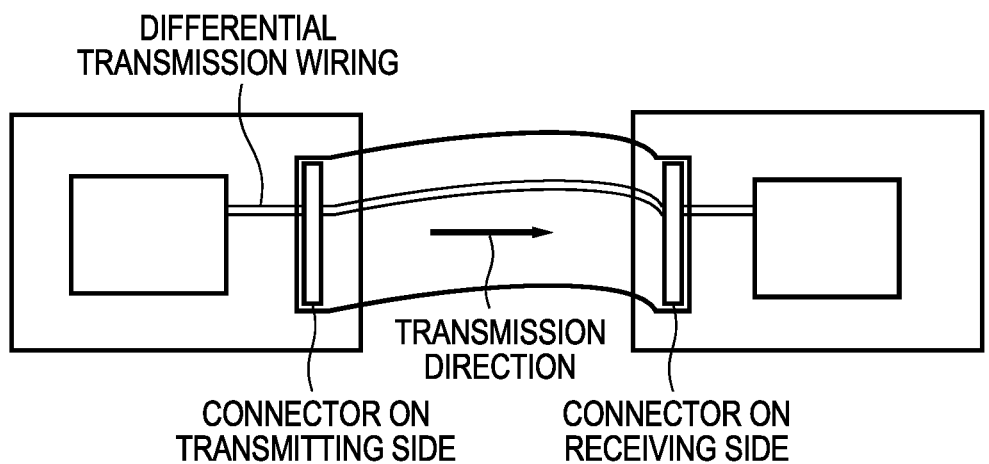
FIGS. 6A and 6B are diagrams illustrating a conventional configuration and impedance profile.
Figure 6B:
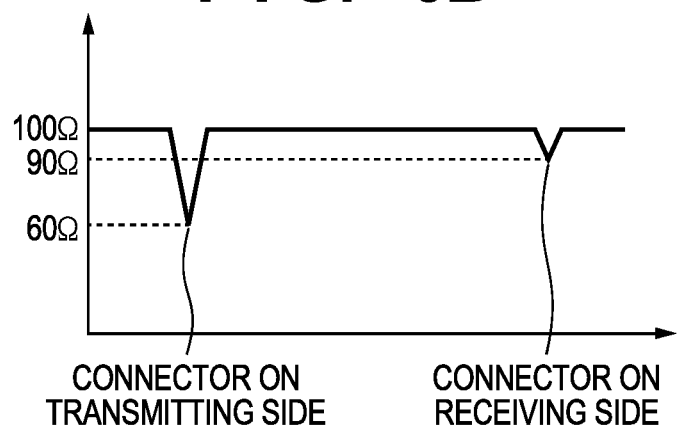

Although it is possible to directly connect the signal processing board 202 and the flexible board 401 as well, direct connection significantly impairs the ease of assembling the image capturing apparatus. Therefore, based on the above-described effects, in this embodiment, only the output side, namely the image sensor board 102 and the flexible board 401, are directly connected. FIG. 2A is a diagram showing a configuration of an electronic component in which the boards are connected via a flexible board with a connector according to the present embodiment, and FIG. 2B is a diagram showing an example of an impedance profile in the configuration shown in FIG. 2A. By connecting the boards in this way, the impedance mismatch at the connection portion between the board on the signal output side and the flexible board can be reduced as compared with the conventional configuration shown in FIGS. 6A and 6B.

Here, the quality of the signal transmitted via the high-speed signal transmission wiring 103 will be described. As a method for evaluating a signal waveform, an eye pattern is generally used for evaluation. An eye pattern is a visual display of signal characteristics by sampling a large number of actual signal waveform transitions and superimposing them. If multiple waveforms overlap at the same position (timing, voltage), an eye pattern shows a good quality waveform, but if multiple waveforms are not at the same positions (timing, voltage), an eye pattern shows a poor quality waveform.

FIGS. 3A and 3B show diagrams for explaining the improvement result of the eye pattern when the high-speed signal transmission line in the first embodiment is used. The diamond shapes shown in FIGS. 3A and 3B are specified masks of the eye pattern, and if the signal waveform is within the specified mask, there is a possibility that the signal transition information cannot be transmitted correctly. FIG. 3A shows a case where the transmitting side is connected via a connector as in the conventional example, and the jitter is large due to the impedance mismatch at the connector portion on the transmitting side. On the other hand, FIG. 3B shows a case where the transmitting side is directly connected as shown in the present embodiment, and the influence of signal reflection due to the impedance mismatch is reduced and the margin for the specified mask is increased.

Returning to FIG. 1, a power supply unit 301 supplies power to the image sensor 101 via a power supply flexible board 501.

The power supply unit 301 is mounted on a board 302, which is hereinafter referred to as a "power supply board". In addition to the power supply unit 301, a power supply board connector fitting portion 303 and other electrical parts (not shown) are mounted on the power supply board 302.

The power supply flexible board 501 is used to connect the image sensor board 102 and the power supply board 302. The power supply flexible board 501 has a flexible board made of polyimide or the like, a wiring layer made of a metal foil or the like, and a cover layer which is an insulating layer, and the power supply wiring 104 is made of a metal such as copper or the like.

The power supply wiring 104 is a power supply wiring pattern formed of a metal such as copper on the image sensor board 102, the power supply flexible board 501, and the power supply board 302, and is a wiring for supplying power to the image sensor 101 from the power supply unit 301.

If the high-speed signal transmission wiring is not included, there is no need to consider signal reflection, so assembling is easier by connecting both sides of the flexible board with connectors. Therefore, in the present embodiment, the power supply board 302 and the power supply flexible board 501 are connected via the power supply board connector fitting portion 303, and the power supply flexible board 501 and the image sensor board 102 are connected via a power supply connector fitting portion 105.

The power supply board connector fitting portion 303 connects the power supply board 302 and the power supply flexible board 501 with a Board to Board connector, a flip lock type connector, or the like. The power supply board connector fitting portion 303 makes it possible to attach/detach the power supply flexible board 501 to/from the power supply board 302 as needed.

In addition, the power supply connector fitting portion 105 connects the image sensor board 102 and the power supply flexible board 501 with a Board to Board connector, a flip lock type connector, or the like. The power supply connector fitting portion 105 makes it possible to attach/detach the power supply flexible board 501 to/from the image sensor board 102 as needed.

As described above, according to the first embodiment, it is possible to provide highly reliable high-speed signal transmission between boards while ensuring ease of assembly by using a flexible board.

Second Embodiment

Figure 4:
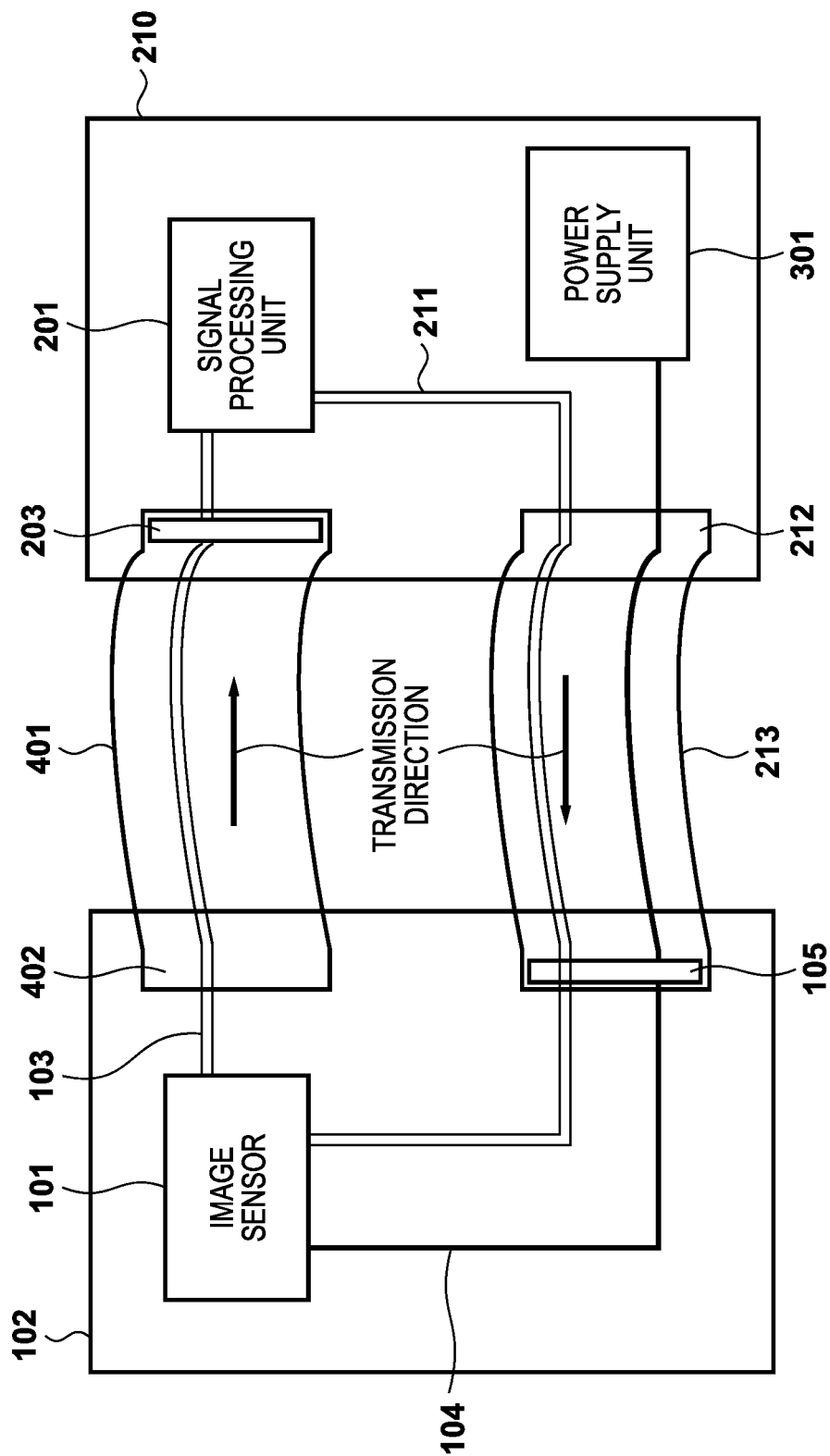
FIG. 4 is a diagram showing a configuration of electronic components according to a second embodiment.

Next, a second embodiment of the present invention will be described. FIG. 4 is a diagram showing the configuration of electronic components in the second embodiment. In FIG. 4, the same reference numerals are given to the same components as those shown in FIG. 1, and the description thereof will be omitted.

In the second embodiment, the signal processing unit 201 and the power supply unit 301 are mounted on a board 210 which is hereinafter referred to as "signal processing board". In the second embodiment, the signal processing unit 201 generates correction data, adjustment data, and the like of the image sensor 101 based on the processed signal. In addition to the signal processing unit 201 and the power supply unit 301, the connector fitting portion 203, a direct connecting portion 212, and other electrical parts (not shown) are mounted on the signal processing board 210, and a high-speed signal transmission wiring 211 is made of a metal such as copper or the like.

A flexible board 213 is used to connect the image sensor board 102 and the signal processing board 210. The flexible board 213 has a flexible board made of polyimide or the like, a wiring layer made of a metal foil or the like, and a cover layer which is an insulating layer, and the high-speed signal transmission wiring 211, power supply wiring 104, and so on, are made of a metal such as copper or the like.

The high-speed signal transmission wiring 211 is a wiring formed on the signal processing board 210, the flexible board 213, and the image sensor board 102 for transmitting correction data and adjustment data of the image sensor 101 from the signal processing unit 201 to the image sensor 101.

As described in the first embodiment, the effect of impedance mismatch is greater at a position closer to the transmitting side than to the receiving side, so it is more effective to adapt the direct connection on the transmitting side. Therefore, in the present embodiment, the signal processing board 210 which is on the signal transmitting side and the flexible board 213 are directly connected at the direct connecting portion 212 with a conductive connecting material without using a connector. On the other hand, the flexible board 213 and the image sensor board 102, which is on the signal receiving side, are connected via the power supply connector fitting portion 105.

The direct connecting portion 212 connects the signal processing board 210 and the flexible board 213 by connecting an opening in which a metal wiring formed on the signal processing board 210 is exposed and an opening (one end portion) in which a metal wiring formed on the flexible board 213 is exposed with a conductive connecting material.

Although it is possible to directly connect the image sensor board 102 and the flexible board 213 as well, direct connection may significantly impair the ease of assembling the image capturing apparatus. Therefore, only the output side, namely the signal processing board 210 and the flexible board 213, are directly connected.

As described above, according to the second embodiment, it is possible to provide highly reliable high-speed signal transmission between boards while ensuring ease of assembly by using flexible boards.

In the above example, the case where the correction data, adjustment data, etc. of the image sensor 101 are transmitted from the signal processing unit 201 to the image sensor 101 has been described, but the present invention is not limited to this, and for example, a control unit for controlling the image sensor 101 may be formed the board 210.

Third Embodiment

Figure 5:
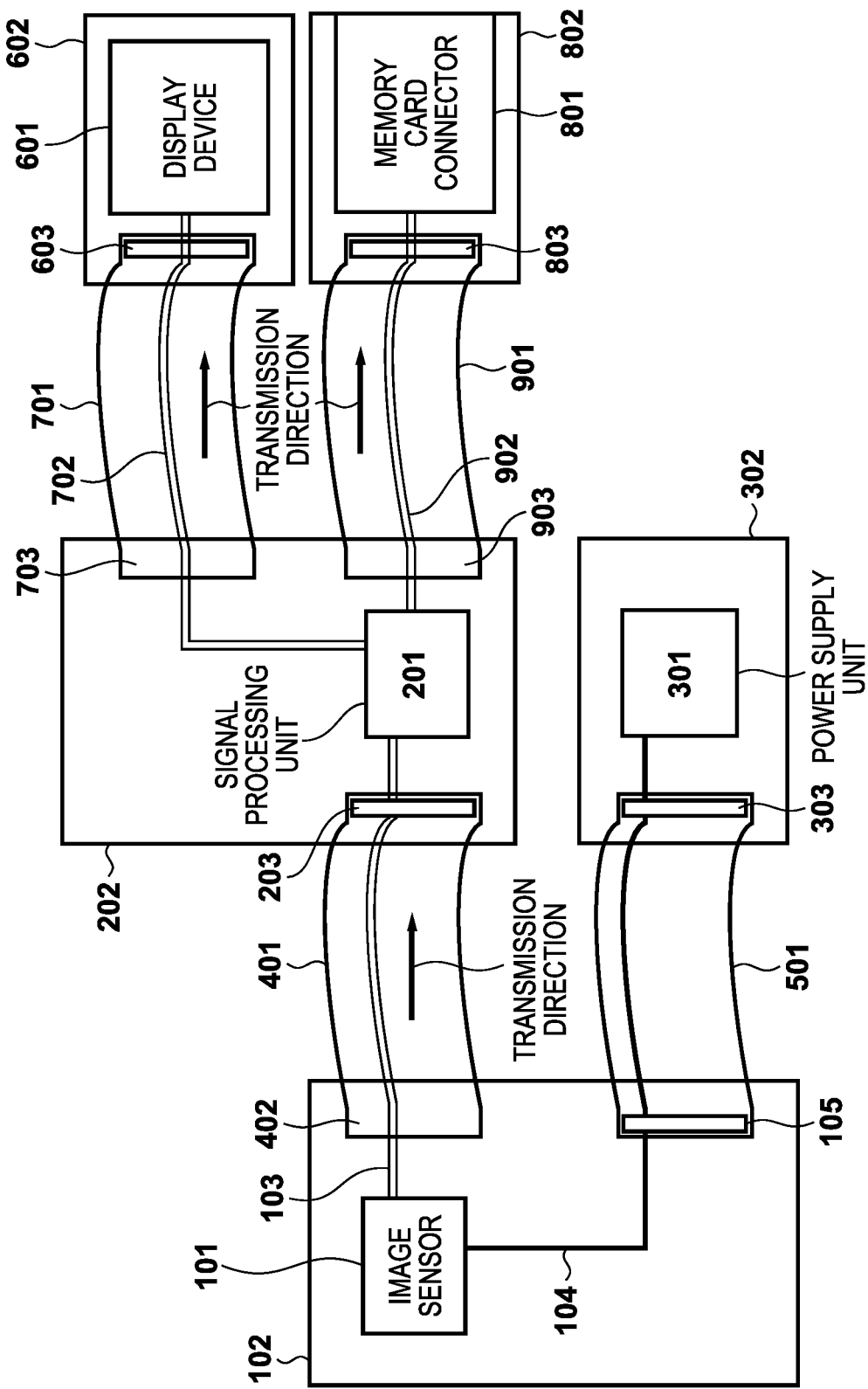
FIG. 5 is a diagram showing a configuration of electronic components according to a third embodiment.

Next, a third embodiment of the present invention will be described. FIG. 5 is a diagram showing the configuration of electronic components in the third embodiment. In FIG. 5, the same reference numerals are given to the same components as those shown in FIG. 1, and the description thereof will be omitted.

A display device 601 is composed of an organic EL, a liquid crystal display, or the like capable of monitoring a reproduced image and a captured image. The display device 601 is mounted on a board 602 which is hereinafter referred to as a "display device board". In addition to the display device 601, electronic parts (not shown) or the like are mounted on the display device board 602, and a high-speed signal transmission wiring 702 for display devices is made of a metal such as copper or the like.

A flexible board 701 for display devices is used to connect the signal processing board 202 and the display device board 602. The flexible board 701 for display devices has a flexible board made of polyimide or the like, a wiring layer made of a metal foil or the like, and a cover layer which is an insulating layer. On the flexible board 701 for display devices, the high-speed signal transmission wiring 702 for display devices, a communication wiring (not shown) for driving the display device 601, and a control signal wiring for the display device 601 are formed with a metal such as copper or the like.

The high-speed signal transmission wiring 702 for display devices is a wiring formed on the signal processing board 202, flexible board 701 for display devices, and display device board 602, for transmitting image data for display and the like from the signal processing unit 201 to the display device 601 at high speed.

As described in the first embodiment, the effect of impedance mismatch is greater at a position closer to the transmitting side comparing to the receiving side, so it is more effective to adapt the direct connection on the transmitting side. Therefore, in the present embodiment, the signal processing board 202 which is on the signal transmitting side and the flexible board 701 for display devices are directly connected at a direct connecting portion 703 with the conductive connecting material without using a connector. On the other hand, the flexible board 701 for display devices and the display device board 602 which is on the signal receiving side are connected via a display board connector fitting portion 603 with a Board to Board connector, a flip lock type connector, or the like. The display board connector fitting portion 603 makes it possible to attach/detach the flexible board 701 for display devices to/from the display device board 602 as needed.

Although it is possible to directly connect the display device board 602 and the flexible board 701 as well, the direct connection may significantly impair the ease of assembling the image capturing apparatus. Therefore, only the output side, namely the signal processing board 202 and the flexible board 701, are directly connected.

A memory card connector 801 is a connector for connecting to a storage medium such as an SD card, a CF card, and the like, and by attaching the storage medium to the memory card connector 801, image data output from the signal processing unit 201 can be recorded. The memory card connector 801 is mounted on a board 802, which is hereinafter referred to as a "memory card board". In addition to the memory card connector 801, electronic parts (not shown) or the like are mounted on the memory card board 802, and a high-speed signal transmission wiring 902 for memory cards is made of a metal such as copper or the like.

A flexible board 901 for memory cards is used to connect the signal processing board 202 and the memory card board 802. The flexible board 901 for memory cards has a flexible board made of polyimide or the like, a wiring layer made of a metal foil or the like, and a cover layer which is an insulating layer. On the flexible board 901 for memory cards, the high-speed signal transmission wiring 902 for memory cards, a communication wiring and a control signal wiring (not shown) for driving the memory card connector 801 are formed with a metal such as copper or the like.

The high-speed signal transmission wiring 902 for memory cards is a wiring formed on the signal processing board 202, flexible board 901 for memory cards, and memory card board 802 for transmitting image data for recording and the like from the signal processing unit 201 to the memory card connector 801.

As described above, the effect of impedance mismatch is greater at a position closer to the transmitting side comparing to the receiving side, so it is more effective to adapt the direct connection on the transmitting side. Therefore, in the present embodiment, the signal processing board 202 which is on the signal transmitting side, and the flexible board 901 for memory cards are directly connected at a direct connecting portion 903 with the conductive connecting material without using a connector. On the other hand, the flexible board 901 for memory cards and the memory card board 802 which is on the signal receiving side are connected via a memory card board connector fitting portion 803 with a Board to Board connector, a flip lock type connector, or the like. The memory card board connector fitting portion 803 makes it possible to attach/detach the flexible board 901 for memory cards to/from the memory card board 802 as needed.

Although it is possible to directly connect the memory card board 802 and the flexible board 901 for memory cards as well, the direct connection significantly impairs the ease of assembling the image capturing apparatus. Therefore, only the output side, namely the signal processing board 210 and the flexible board 901 for memory cards, are directly connected.

As described above, according to the third embodiment, it is possible to provide highly reliable high-speed signal transmission between boards, including a display device, a memory card, and so forth, while ensuring ease of assembly by using a flexible board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-157241, filed Sep. 27, 2021 which is hereby incorporated by reference herein in its entirety.

What is claimed is:

1. An electronic component comprising:
   a first board;
   a first flexible board that is used to connect the first board and a second board; and
   a first transmission wiring, formed on the first board, the second board and the first flexible board, that transmits a signal from the first board to the second board,
   wherein one end of the first flexible board is connected to the first board with a conductive connecting material, and a connector capable of attaching to and detaching from the second board is provided on the other end of the first flexible board, and
   an image sensor is mounted on the first board and a signal processing unit is mounted on the second board, and the first transmission wiring transmits an image signal output from the image sensor to the signal processing unit.

2. The electronic component according to claim 1, further comprising:
   the second board;
   a second flexible board that is used to connect the first board and the second board; and
   a second transmission wiring, formed on the first board, the second board, and the second flexible board, that transmits a signal from the second board to the first board,
   wherein one end of the second flexible board is connected to the second board with a conductive connecting material, and a connector capable of attaching to and detaching from the first board is provided on the other end of the second flexible board.

3. The electronic component according to claim 2, wherein the second transmission wiring transmits correction data and adjustment data of the image sensor output from the signal processing unit to the image sensor.

4. The electronic component according to claim 2, wherein the second transmission wiring performs differential transmission.

5. The electronic component according to claim 1, wherein the first transmission wiring performs differential transmission.

6. An electronic component comprising:
   a first board;
   a second board;
   a first flexible board that is used to connect the first board and the second board;
   a second flexible board that is used to connect the first board and the second board;
   a first transmission wiring, formed on the first board, the second board and the first flexible board, that transmits a signal from the first board to the second board;

a second transmission wiring, formed on the first board, the second board, and the second flexible board, that transmits a signal from the second board to the first board, wherein one end of the first flexible board is connected to the first board with a conductive connecting material, and a connector capable of attaching to and detaching from the second board is provided on the other end of the first flexible board, and one end of the second flexible board is connected to the second board with a conductive connecting material, and a connector capable of attaching to and detaching from the first board is provided on the other end of the second flexible board, and an image sensor is mounted on the first board and a control unit is mounted on the second board, and the second transmission wiring transmits a signal for controlling the image sensor output from the control unit to the image sensor.

7. An electronic component comprising:

a first board;

a first flexible board that is used to connect the first board and a second board; and a first transmission wiring, formed on the first board, the second board and the first flexible board, that transmits a signal from the first board to the second board, wherein one end of the first flexible board is connected to the first board with a conductive connecting material, and a connector capable of attaching to and detaching from the second board is provided on the other end of the first flexible board, and a signal processing unit is mounted on the first board and a display device is mounted on the second board, and the first transmission wiring transmits image data for display output from the signal processing unit to the display device.

8. An electronic component comprising:

a first board;

a first flexible board that is used to connect the first board and a second board; and a first transmission wiring, formed on the first board, the second board and the first flexible board, that transmits a signal from the first board to the second board, wherein one end of the first flexible board is connected to the first board with a conductive connecting material, and a connector capable of attaching to and detaching from the second board is provided on the other end of the first flexible board, and a signal processing unit is mounted on the first board and a memory card connector is mounted on the second board, and the first transmission wiring transmits image data for recording output from the signal processing unit to the memory card connector.

9. An electronic component comprising:

a first board;

a first flexible board that is used to connect the first board and a second board; and a first transmission wiring, formed on the first board, the second board and the first flexible board, that transmits a signal from the first board to the second board, a third flexible board that is used to connect the first board to a third board; and a third transmission wiring, formed on the first board, the third board and the third flexible board, that transmits a signal from the first board to the third board, wherein one end of the first flexible board is connected to the first board with a conductive connecting material, and a connector capable of attaching to and detaching from the second board is provided on the other end of the first flexible board, and one end of the third flexible board is connected to the first board with a conductive connecting material, and a connector capable of attaching to and detaching from the third board is provided on the other end of the third flexible board.

10. The electronic component according to claim 9, wherein a signal processing unit is mounted on the first board and a display device is mounted on the second board, and the first transmission wiring transmits image data for display output from the signal processing unit to the display device, and a memory card connector is mounted on the second board, and the third transmission wiring transmits image data for recording output from the signal processing unit to the memory card connector.

11. The electronic component according to claim 9, wherein the third transmission wiring performs differential transmission.

* * * * *